United States Patent [19]
Eimori et al.

[11] Patent Number: 5,637,899
[45] Date of Patent: Jun. 10, 1997

[54] SEMICONDUCTOR DEVICE

[75] Inventors: Takahisa Eimori; Toshiyuki Oashi; Kenichi Shimomura, all of Hyogo, Japan

[73] Assignee: Mitsubishi Denki Kabushiki Kaisha, Tokyo, Japan

[21] Appl. No.: 640,638

[22] Filed: May 1, 1996

[30] Foreign Application Priority Data

Oct. 11, 1995 [JP] Japan .................................. 7-263096

[51] Int. Cl.⁶ ..................... H01L 27/01; H01L 27/12; H01L 31/0392
[52] U.S. Cl. ..................... 257/347; 257/57; 257/66; 257/349
[58] Field of Search ..................... 257/347, 57, 66, 257/349

[56] References Cited

FOREIGN PATENT DOCUMENTS 62-109355  5/1987  Japan .
1-91470   4/1989  Japan .

OTHER PUBLICATIONS

"Silicon–on–Insulator Technology" J. Colinge pp. 102–105 Kluwer Academic Publishers.

*Handotai Kenkyu 40*, published by Kogyuchosakai pp. 166–167, publication date unknown.

*Primary Examiner*—Sara W. Crane
*Assistant Examiner*—Douglas A. Wille
*Attorney, Agent, or Firm*—Lowe, Price, LeBlanc & Becker

[57] ABSTRACT

An SOI-MOS transistor structure is obtained which enables prevention of a substrate floating effect, reduction of the gate capacity and the contact resistance, and connection of two or more transistors in series. A semiconductor device including this transistor includes a pair of $n^+$ type source/drain regions and a $p^+$ type channel potential fixing region formed by dividing an active region by a first wiring and a second wiring, and a third wiring and a fourth wiring extending from respective side portions of the wirings. Since holes stored in an effective channel region flow in the $p^+$ type channel potential fixing region, the substrate flowing effect can be prevented. Since one region of the pair of $n^+$ type source/drain regions is wider than the other region, the contact resistance can be decreased. Further, since the gate wirings are not connected to each other, transistors can be connected in series.

9 Claims, 18 Drawing Sheets 5,637,899

SEMICONDUCTOR DEVICE

BACKGROUND OF THE INVENTION

1. Field of the Invention

The present invention relates to semiconductor devices, and more particularly, to a semiconductor device having an SOI-MOS transistor which prevents a substrate floating effect.

2. Description of the Background Art

An MOS transistor provided in a semiconductor layer formed on an insulating layer is generally called an SOI-MOS (Silicon On Insulator-Metal Oxide Semiconductor) transistor. Since the SOI-MOS transistor isolates elements by insulation, and can isolate the elements including a substrate completely, it suffers from a less leakage current, and has a higher current driving ability. Further, the SOI-MOS transistor can suppress a short channel effect and the like.

Therefore, the SOI-MOS transistor is expected as a future basic structure of a transistor used in a memory device and a logic circuit on the order of quarter micron. A typical structure of the SOI-MOS transistor is shown in FIG. 30. The SOI-MOS transistor includes a pair of n$^+$ type source/drain regions 3 positioned on both sides of a gate wiring 17 formed on an active region 5. The n$^+$ type source/drain region 3 is connected with another element (not shown) through an n$^+$ type source/drain contact 9. A transistor having such a structure as described above raises various problems as miniaturization progresses. More specifically, when the channel length becomes shorter than 1 μm, there occur a steep current rising in the $I_D$–$I_G$ characteristics, a kink phenomenon in the $I_D$—$V_D$ characteristics, decrease of the source/drain breakdown voltage, a latch phenomenon in the $I_D$–$V_G$ characteristics and the like, as described in *Handotai Kenkyu* 40, published by Kogyochosakai: 166 and 167.

These phenomena cause characteristics of the SOI-MOS transistor to degrade. Such degradation of the characteristics is due to a substrate floating effect. The substrate floating effect is called a parasitic bipolar effect.

The parasitic bipolar effect will be described with reference to FIG. 31. When a drain voltage is increased, an electric field in a channel direction becomes substantially large in the vicinity of a drain region 33. An electron 30 in an effective channel region 11 positioned underneath gate wiring 17 is accelerated (indicated by a reference number 31) by this strong electric field to attain a high energy state. The electron in this state collides (indicated by a reference number 34) with a silicon atom in the vicinity of an end portion of drain region 33 to generate a large number of electron-hole pairs. An electron 35 of the electron-hole pair generated by impact ionization is attracted by a high drain electric field to flow in drain region 33 to form part of a drain current. On the other hand, a hole 7 is carried back by the drain electric field to be stored underneath effective channel region 11.

When the holes generated by impact ionization are stored under effective channel region 11 as described above, the potential in the vicinity of effective channel region 11 and a source region 32 increases, causing the height of a source-drain potential barrier to decrease and inducing injection of an electron 36 from source region 32. This causes the above described parasitic bipolar effect.

As a direct method for preventing such a parasitic bipolar effect caused by the substrate floating effect, a channel potential fixation structure for fixing the potential in a channel region has been proposed. For example, an H-shaped channel potential fixation structure having H-gate wiring 17 as shown in FIG. 32 and a T-shaped channel potential fixation structure having T-gate wiring 17 as shown in FIG. 33 or 34 are disclosed by J. Colinge, "Silicon-on-Insulator Technology" :102–104, for example.

Referring to FIG. 32, active region 5 is divided into four regions by H-gate wiring 17 having a first wiring 1, a second wiring 2, and a third wiring 14. More specifically, the pair of n$^+$ type source/drain regions 3 having n$^+$ type source/drain contacts 9 are positioned on both sides of first wiring 1 sandwiched by one side portion of second wiring 2 and one side portion of third wiring 14 opposite thereto. A p$^+$ type channel potential fixing region 4 is positioned on the respective other side portions of second wiring 2 and third wiring 14. A region underneath gate wiring 17 is of p type. Effective channel region 11 is under first wiring 1.

Referring to FIG. 33 or 34, active region 5 is divided into three regions by T-gate wiring 17 having first wiring 1 and second wiring 2. The pair of n$^+$ type source/drain regions 3 are positioned on both side portions of first wiring 1 on one side portion of second wiring 2. On the other side portion of second wiring 2, p$^+$ type channel potential fixing region 4 is positioned. Underneath first wiring 1 is p type effective channel region 11.

In the above described SOI-MOS transistor structure, holes flowing in effective channel region 11 pass through the p type region positioned under second wiring 2 or third wiring 14 to p$^+$ type channel potential fixing region 4 to be ejected by a p$^+$ type channel potential fixing contact 10. As a result, the substrate floating effect can be prevented.

Then, consider a transistor formed by connecting a plurality of SOI-MOS transistors each having such a structure. FIG. 35 shows a transistor in which two SOI-MOS transistors shown in FIG. 32 are connected laterally in series. As shown in FIG. 35, second wirings 2 and third wirings 14 of the two transistors are connected to each other. Therefore, the gate potentials of the two transistors are the same. Since the potentials of individual transistors cannot be controlled, this transistor structure cannot be used in general. Further, in such an SOI-MOS transistor as shown in FIG. 36, second wirings 2 of individual transistors are connected to each other, so that the gate potentials of the transistors are the same. Therefore, the SOI-MOS transistor shown in FIG. 36 cannot be used in general.

In the structure shown in FIG. 32, 33, 35, or 36, second wiring 2 or third wiring 14 is formed on the active region excluding effective channel region 11. These wirings serve as a mask material in formation of p$^+$ type channel potential fixing region 4. However, these wirings increase the capacity of the gate wiring and underlying active region 5, causing the processing speed of the transistor to decease.

When two SOI-MOS transistors shown in FIG. 34 are connected in series, such a structure as shown in FIG. 37 can be formed. In this structure, the gate wirings of respective transistors are not connected to each other, and the channel potentials can be fixed individually.

However, the SOI-MOS transistor shown in FIG. 34 has a problem in its manufacturing process. More specifically, if mask deviation occurs in formation of the gate wiring, one end portion of second wiring 2 may be formed within active region 5 as shown in FIG. 38 (indicated by B in the figure). First wiring 1 and second wiring 2 serve as a mask for ion implantation in forming p$^+$ type channel potential fixing region 4 for channel potential fixation. Therefore, if the gate wiring is formed as shown in FIG. 38, p⁺ type ions are to be implanted also in part of n⁺ type source/drain region 3. As a result, the breakdown voltage between n⁺ type source/drain region 3 and p⁺ type channel potential fixing region 4 cannot be maintained, and this SOI-MOS transistor cannot serve as a transistor. Note that in FIG. 38, the corners of the pattern are curved by diffraction at the time of exposure.

Further, the area of n⁺ type source/drain contact 9 formed in n⁺ type source/drain region 3 decreases with miniaturization of the device. The reduced contact area increases the resistance of the contact, and deteriorates the electric characteristics of the transistor.

As described above, in order to prevent the parasitic bipolar effect caused by the substrate floating effect in the conventional SOI-MOS transistor, such a structure as including the channel potential fixing region as shown in FIGS. 32 to 34 has been considered. However, when a plurality of SOI-MOS transistors are connected, gate wirings of the respective transistors are connected to each other. Therefore, the gate potentials of the individual transistors cannot be controlled, and this structure cannot be used in general.

Even if such a structure as shown in FIG. 37 is employed which can control the gate potentials of the individual transistors, there is a problem associated with mask deviation in forming the gate wiring. More specifically, as shown in FIG. 38, n⁺ type source/drain region 3 and p⁺ type channel potential fixing region 4 are electrically connected. Therefore, this structure does not function as a transistor.

Further, it is necessary to form second wiring 2 or third wiring 14 as shown in FIG. 32 or 33 in order to add p⁺ type channel potential fixing region 4. This increases a so-called gate capacity of the gate wiring and the active region, causing the processing speed to decrease.

With miniaturization of the device, the size of n⁺ type source/drain contact 9 connected to n⁺ type source/drain region 3 becomes smaller in FIG. 32 or 33. This decreases the contact area, thereby increasing the contact resistance to deteriorate the electric characteristics.

SUMMARY OF THE INVENTION

One object of the present invention is to obtain an SOI-MOS transistor which can reduce a gate capacity and a contact resistance to improve electric characteristics, by structuring the SOI-MOS transistor so as to allow a connection of a plurality of the transistors and individual operation thereof and to prevent influence of deviation of a gate wiring, if it occurs, on the manufacturing process of the SOI-MOS transistor.

According to one aspect of the present invention, a semiconductor device includes an active region of a semiconductor layer formed on an insulating film and surrounded by an isolation region, and a gate wiring. The gate wiring includes a first wiring formed on the active region so as to cross the same, and a second wiring extending from one side portion of the first wiring toward the isolation region.

The active region includes a first region positioned on the other side portion of the first wiring, and second and third regions positioned on both sides of the second wiring on one side portion of the first wiring.

The first to third regions each have a region in their surfaces in which a contact for an electric connection with another element can be formed. The first and second regions are of a first conductivity type. On the other hand, the third region and a region positioned underneath the gate wiring are of a second conductivity type. Further, the first wiring and the first and second regions constitute an SOI-MOS transistor.

According to this structure, a contact can be formed in each region. Holes stored in the region under the first wiring flow in the region of the second conductivity type. One of the two regions of the first conductivity type can be formed wider than the other region. With the first wiring and the second wiring crossing the active region used as a mask, the region of the second conductivity type can be formed in a self-alignment manner.

As a result, the parasitic bipolar effect can be prevented. The resistance of the contact formed in each region can be reduced, and the contact between the region of the first conductivity type and the region of the second conductivity type associated with positional deviation of the gate wiring can be prevented.

Therefore, a semiconductor device including an SOI-MOS transistor superior in electric characteristics and having high reliability can be obtained.

The isolation region may go into the first region and the region positioned underneath the gate wiring, and a part of a boundary between the isolation region and the active region may be positioned underneath and along the first wiring.

In such a case, a contact area between the first wiring and the region underneath the first wiring is decreased.

Therefore, the gate capacity is decreased. As a result, the operation speed of the transistor is increased, and a semiconductor device of a high performance can be obtained.

Further, the isolation region may go into the third region and the region positioned underneath the gate wiring, and a part of the boundary between the isolation region and the active region may be positioned underneath and along the first wiring and the second wiring.

Also in such a case, a contact area between the first wiring and the second wiring and the region underneath these wirings is decreased.

Therefore, the gate capacity is reduced. As a result, the operation speed of the transistor is increased, and a semiconductor device of a high performance can be obtained.

According to another aspect of the present invention, a semiconductor device includes an active region of a semiconductor layer formed on an insulating film and surrounded by an isolation region, and a gate wiring.

The gate wiring includes a wiring formed on the active region so as to cross the same.

The active region includes a first region positioned on one side portion of the wiring. The active region further includes, in a region positioned on the other side portion of the wiring, a bay-shaped isolation region which goes underneath the wiring so as to divide the region to two and whose boundary with the active region is partly positioned underneath and along the wiring. The active region includes second and third regions on both sides of the bay-shaped isolation region.

The first to third regions each have a size which allows formation of a contact for an electric connection to another element in their surfaces. The first and second regions are of a first conductivity type. On the other hand, the third region and the region positioned underneath the gate wiring are of a second conductivity type. The wiring, and the first and second regions constitute an SOI-MOS transistor.

According to this structure, holes stored in the region underneath the wiring flow in the region of the second conductivity type. One of the two regions of the first conductivity type can be formed wider than the other region. A contact area between the gate wiring and the region underneath the gate wiring is decreased.

Therefore, the parasitic bipolar effect can be prevented. The contact resistance in each region can be decreased. The gate capacity is reduced.

As a result, a semiconductor device including an SOI-MOS transistor of a high performance superior in electric characteristics and operating at a high speed can be obtained.

According to still another aspect of the present invention, a semiconductor device includes an active region of a semiconductor layer formed on an insulating film and surrounded by an isolation region, and a gate wiring.

The gate wiring includes a first wiring and a second wiring formed on the active region so as to cross the same without crossing each other. The gate wiring further includes a third wiring formed from one side portion of the first wiring toward the isolation region, and a fourth wiring formed from one side portion of the second wiring toward the isolation region.

The active region includes a first region positioned on the respective other side portions of the first wiring and the second wiring. The active region further includes second and third regions positioned on both sides of the third wiring on one side portion of the first wiring. The active region further includes fourth and fifth regions positioned on both sides of the fourth wiring on one side portion of the second wiring.

The first to fifth regions each have a size allowing formation of a contact for an electric connection with another element in their surfaces. The first, second, and fourth regions are of a first conductivity type. On the other hand, the third and fifth regions and a region positioned underneath the gate wiring are of a second conductivity type. The first and second wirings, and the first, second, and fourth regions constitute an SOI-MOS transistor.

According to this structure, the gate wirings of two transistors are not connected to each other. Holes stored in the region under the first wiring or the second wiring flow in the region of the second conductivity type. A contact can be formed in each region. One of two regions of the first conductivity type of one transistor is formed wider than the other region. With part of the first to fourth wirings crossing the active region used as a mask, the region of the second conductivity type can be formed in a self-alignment manner.

Therefore, the gate potentials of two transistors can be controlled individually. Further, the parasitic bipolar effect of the individual transistors can be prevented. The contact resistance in each region can be reduced. The contact between the region of the first conductivity type and the region of the second conductivity type caused by positional deviation of the gate wiring can be prevented.

As a result, a semiconductor device can be obtained including an SOI-MOS transistor of high reliability which allows series connection of two or more SOI-MOS transistors and which is superior in electric characteristics.

According to a further aspect of the present invention, a semiconductor device includes an active region of a semiconductor layer formed on an insulating film and surrounded by an isolation region, and a gate wiring.

The gate wiring includes a first wiring and a second wiring formed on the active region so as to cross the same without crossing each other. The gate wiring further includes a third wiring and a fourth wiring formed on respective one side porions of the first wiring and the second wiring opposite to each other toward the isolation region so as not to cross each other.

The active region includes a first region positioned on respective one side portions of the first wiring and the second wiring and on respective one side portions of the third wiring and the fourth wiring opposite to each other. The active region further includes a second region positioned on one side portion of the first wiring and the other side portion of the third wiring. The active region includes a third region positioned on one side portion of the second wiring and the other side portion of the fourth wiring. The active region further includes a fourth region positioned on the other side portion of the first wiring and a fifth region positioned on the other side portion of the second wiring.

The first to fifth regions each have a size allowing formation of a contact for an electric connection with another element in their surfaces. The first, fourth, and fifth regions are of a first conductivity type. On the other hand, the second and third regions and a region positioned underneath the gate wiring are of a second conductivity type. The first and second wirings, and the first, fourth, and fifth regions constitute an SOI-MOS transistor.

According to a further aspect of the present invention, a semiconductor device includes a gate wiring including a first wiring and a second wiring formed on an active region so as to cross the same without crossing each other.

In a region positioned on respective one side portions of the first wiring and the second wiring opposite to each other, an island-shaped isolation region is provided which divides the region to two, which goes underneath the first and second wirings, and whose boundary with the active region is partly positioned underneath and along the first and second wirings. The active region includes first and second regions on both sides of the island-shaped isolation region. The active region further includes a third region positioned on the other side portion of the first wiring and a fourth region positioned on the other side porion of the second wiring.

The first to fourth regions each have a size allowing formation of a contact for an electric connection with another element in their surfaces. The first, third, and fourth regions are of a first conductivity type. On the other hand, the second region and a region positioned underneath the gate wiring are of a second conductivity type. The first and second wirings, and the first, third, and fourth regions constitute an SOI-MOS transistor.

The structure of a semiconductor device according to the above aspects of the present invention brings about not only the above described effects but also the following effects. More specifically, the contact area between the first and second wirings and the region positioned underneath these wirings is decreased, and the gate capacity is reduced. Since one region of the first conductivity type and the region of the second conductivity type are shared by two transistors, the element area can be decreased.

As a result, the operation speed of the SOI-MOS transistor is increased, and higher integration of the device can be implemented.

The foregoing and other objects, features, aspects and advantages of the present invention will become more apparent from the following detailed description of the present invention when taken in conjunction with accompanying drawings.

DESCRIPTION OF THE PREFERRED EMBODIMENTS

First Embodiment

Figure 1:
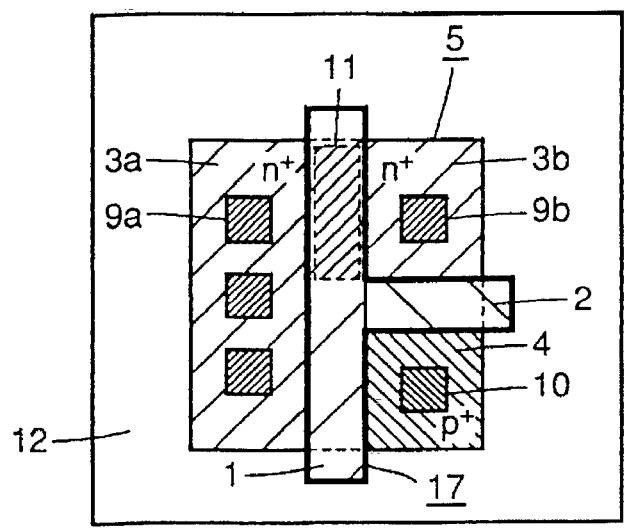
FIG. 1 is a top view showing an SOI-MOS transistor according to a first embodiment of the present invention.

The first embodiment will be described with reference to the drawings. Referring to an SOI-MOS transistor in FIG. 1, in active region 5 surrounded by an isolation region 12, gate wiring 17 includes first wiring 1 and second wiring 2 extending from one side portion of first wiring 1 toward isolation region 12. One region 3a of the pair of $n^+$ type source/drain regions is positioned on the other side portion of first wiring 1. The other region 3b of the pair of $n^+$ type source/drain regions and $p^+$ type channel potential fixing region 4 are positioned on both side portions of second wiring 2 on one side portion of first wiring 1. The pair of $n^+$ type source/drain regions 3a, 3b and $p^+$ type channel potential fixing region 4 include $n^+$ type source/drain contacts 9a, 9b and $p^+$ type channel potential fixing contact 10. One region 3a of the pair of $n^+$ type source/drain regions is wider than the other region 3b. Therefore, the channel region of the SOI-MOS transistor is effective channel region 11.

Figure 2:
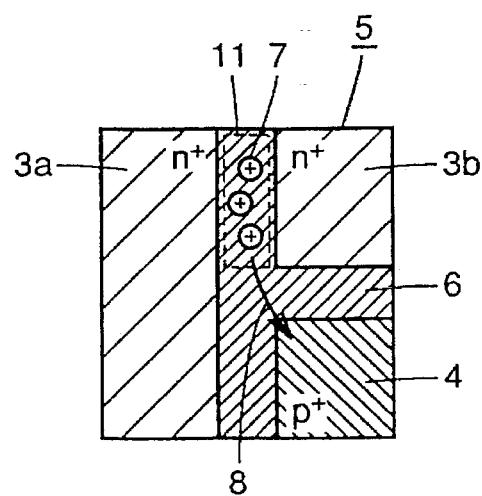
FIG. 2 is a top view showing an active region under a gate wiring of the SOI-MOS transistor shown in FIG. 1.

Referring to FIG. 2, a p type region 6 is formed underneath first wiring 1 and second wiring 2. As described in the section of "Description of the Background Art," hole 7 generated by the substrate floating effect flows in effective channel region 11. Hole 7 flowing in effective channel region 11 passes through p type region 6 to $p^+$ type channel potential fixing region 4, as indicated by an arrow 8. Therefore, the channel potential can be fixed.

As described above, one region 3a of the pair of $n^+$ type source/drain regions is larger in area than the other region 3b. Therefore, by increasing the contact diameter and the number of contacts, the contact area can substantially be increased. Since the contact resistance can be decreased, the electric characteristics of the SOI-MOS transistor can be improved.

Since $p^+$ type channel potential fixing region 4 is formed in a self-alignment manner with part of first wiring 1 formed so as to cross active region 5 and second wiring 2 extending from a side portion of first wiring 1 used as a mask, $p^+$ type channel potential fixing region 4 and $n^+$ type source/drain region 3a, 3b do not come in contact with each other in the manufacturing process even if mask deviation occurs in the gate wiring. Therefore, the operation characteristics of the SOI-MOS transistor can be stabilized against mask deviation of the gate wiring.

Figure 3:
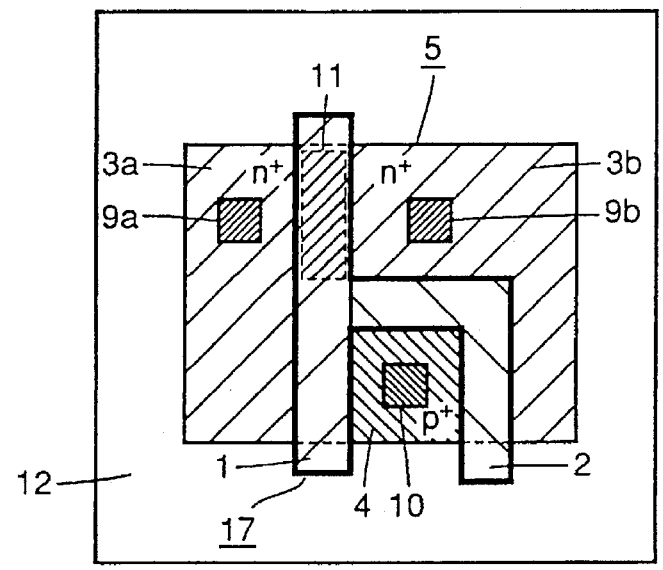
FIG. 3 is a top view showing another SOI-MOS transistor according to the first embodiment of the present invention.

Second wiring 2 may be bent in the structure shown in FIG. 1, as shown in FIG. 3. According to the SOI-MOS transistor having bent second wiring 2, the other region 3b of the pair of $n^+$ type source/drain regions can also be made larger, and the contact resistance can be decreased. Therefore, an SOI-MOS transistor superior in the electric characteristics can be obtained.

Second Embodiment

Figure 4:
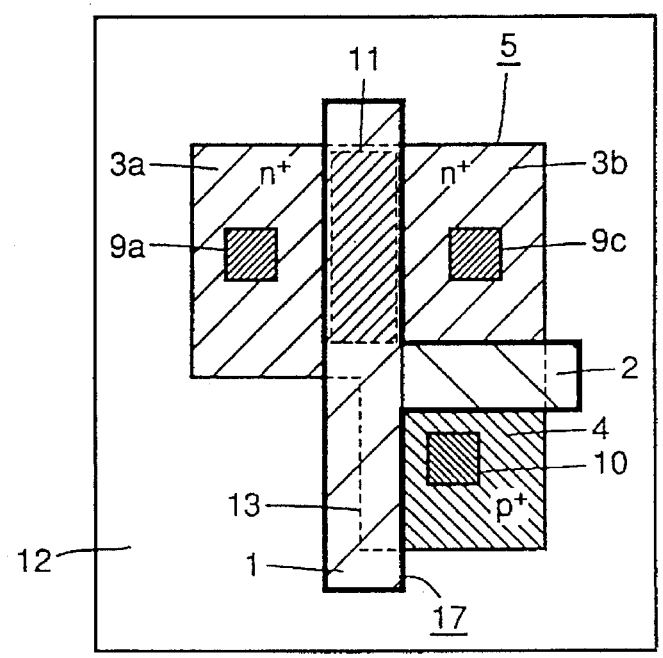
FIG. 4 is a top view showing an SOI-MOS transistor according to a second embodiment of the present invention.

The second embodiment of the present invention will now be described. Referring to FIG. 4, isolation region 12 goes into part of one region of the pair of $n^+$ type source/drain regions 3 and a region underneath first wiring 1 in the SOI-MOS transistor structure shown in FIG. 1. A part 13 of a boundary between isolation region 12 and active region 5 is positioned underneath and along first wiring 1.

According to this structure, a contact area between first wiring 1 and the region underneath first wiring 1 becomes smaller. Therefore, the capacity of the gate wiring can be reduced, and the operation speed of the transistor can be increased.

Figure 5:
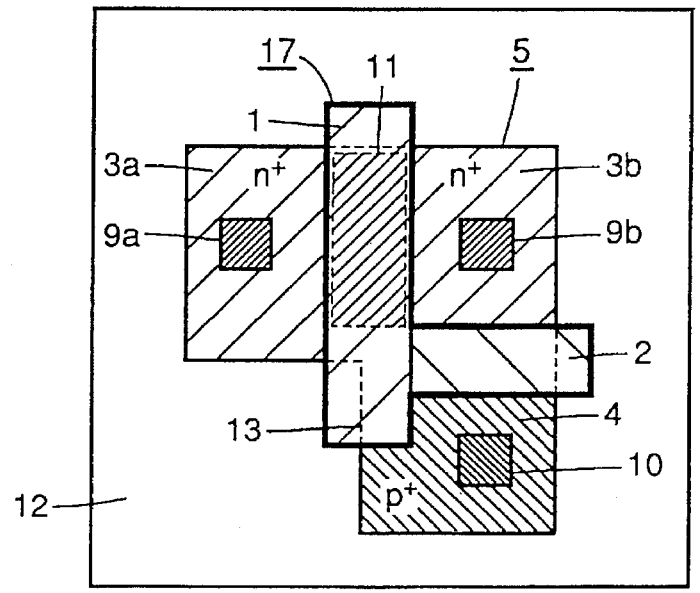
FIG. 5 is a top view showing another SOI-MOS transistor according to the second embodiment of the present invention.
Figure 6:
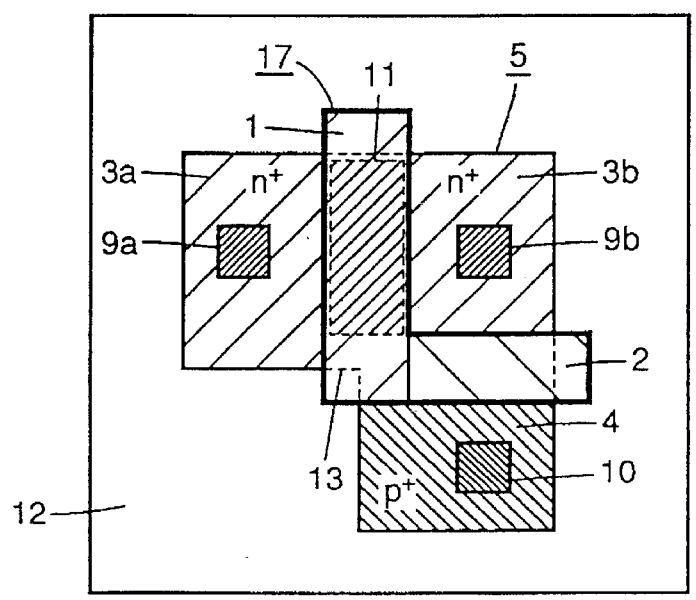
FIG. 6 is a top view showing still another SOI-MOS transistor according to the second embodiment of the present invention.

Further, first wiring 1 of the SOI-MOS transistor shown in FIG. 4 can be shortened in a portion excluding effective channel region 11, as shown in FIGS. 5 and 6. In these cases, the contact area between first wiring 1 and the region underneath first wiring 1 becomes far smaller, and the gate capacity can be further reduced. Therefore, the operation speed can be more increased, and an SOI-MOS transistor superior in the electric characteristics can be obtained.

Third Embodiment

Figure 7:
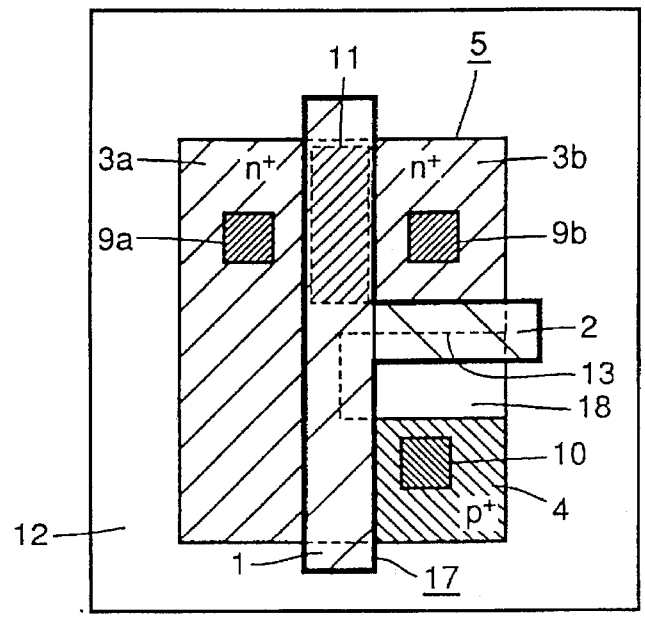
FIG. 7 is a top view showing an SOI-MOS transistor according to a third embodiment of the present invention.

The third embodiment of the present invention will now be described. Referring to FIG. 7, isolation region 12 includes a bay-shaped isolation region 18 going into part of $p^+$ type channel potential fixing region 4 and a region underneath first wiring 1 and second wiring 2 in the SOI-MOS transistor structure shown in FIG. 1. Part 13 of a boundary between bay-shaped isolation region 18 and active region 5 is positioned underneath and along first wiring 1 and second wiring 2.

According to this structure, the contact area between first wiring 1 and second wiring 2, and the region underneath first wiring 1 and second wiring 2 becomes smaller. Therefore, the capacity of the gate wiring can be reduced and the operation speed of the transistor can be increased.

Since gate wiring 17 serving as part of a mask in formation of $p^+$ type channel potential fixing region 4 in a self-alignment manner may be formed so as to be positioned on a portion of the boundary between bay-shaped isolation region 18 going into active region 5 and active region 5, a margin for mask deviation of the gate wiring is high. Therefore, operation of the transistor can be stabilized against variation of lithography and processing of the gate wiring.

Figure 8:
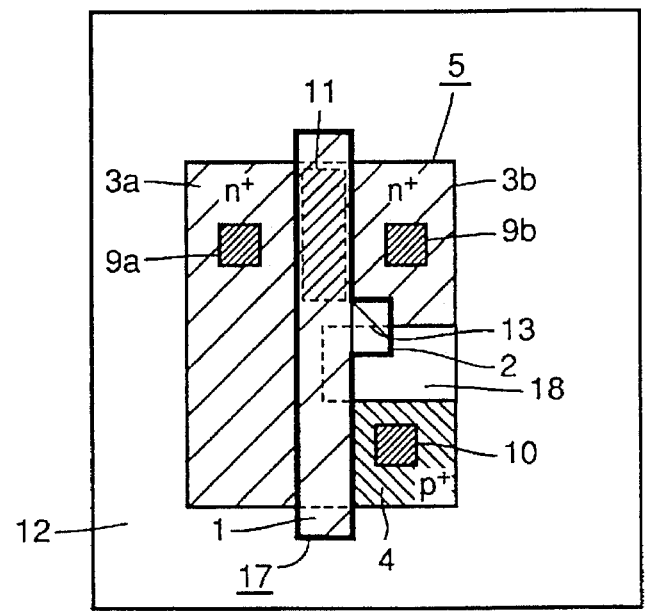
FIG. 8 is a top view showing another SOI-MOS transistor according to the third embodiment of the present invention.

Further, second wiring 2 can be shortened as shown in FIG. 8. In this case, the gate capacity is further reduced, and the electric characteristics can be further improved.

Figure 9:
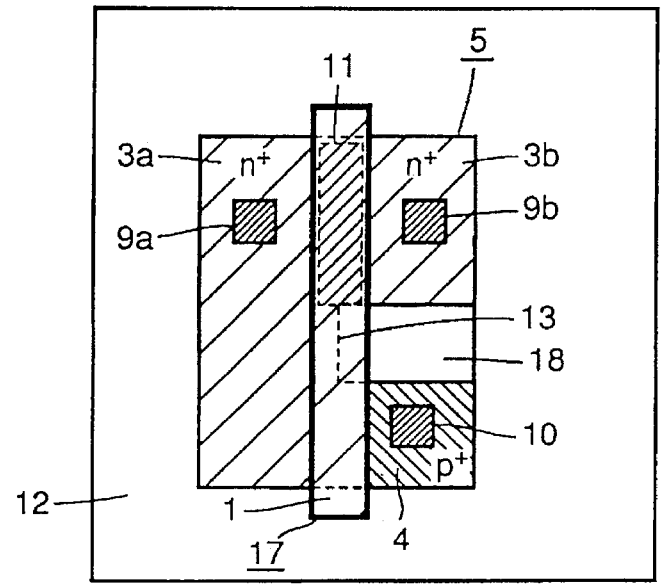
FIG. 9 is a top view showing still another SOI-MOS transistor according to the third embodiment of the present invention.

Further, second wiring 2 may be shortened, so that only first wiring 1 is finally included as shown in FIG. 9. In this structure, the gate capacity can be further reduced. Therefore, the operation speed of the transistor can be further improved.

The structure of one SOI-MOS transistor was described above. By using the transistor structure shown in the first to third embodiments, a plurality of transistors can be connected. Description will now be given of the case where a plurality of SOI-MOS transistors are connected.

Fourth Embodiment

Figure 10:
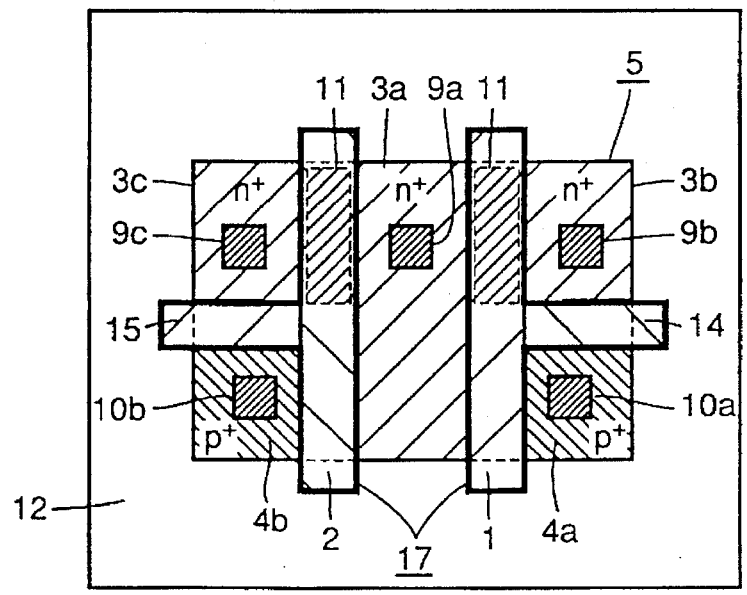
FIG. 10 is a top view showing an SOI-MOS transistor according to a fourth embodiment of the present invention.

The fourth embodiment of the present invention will now be described. Referring to FIG. 10, in active region 5 surrounded by isolation region 12, gate wiring 17 includes first wiring 1 and second wiring 2 formed on active region 5 so as to cross the same without crossing each other. Gate wiring 17 further includes a third wiring 14 and a fourth wiring 15 extending from respective one side potions of first wiring 1 and second wiring 2 toward isolation region 12. Active region 5 includes one region 3a of the pair of $n^+$ type source/drain regions sandwiched by the respective other side portions of first wiring 1 and second wiring 2, and the other region 3b of the pair of $n^+$ type source/drain regions and $p^+$ type channel potential fixing region 4a on both sides of third wiring 14 on one side portion of first wiring 1. Further, active region 5 includes the other region 3c of the pair of $n^+$ type source/drain regions and $p^+$ type channel potential fixing region 4b on both sides of fourth wiring 15 on one side portion of second wiring 2. The $n^+$ source/drain contacts 9a, 9b, 9c are provided in the pair of $n^+$ type source/drain regions 3a, 3b, 3c and $p^+$ type channel potential fixing contact 10a, 10b is provided in $p^+$ type channel potential fixing region 4a, 4b. This structure is equivalent to a series connection of two SOI-MOS transistors shown in FIG. 1 with one region of the pair of $n^+$ type source/drain regions 3 shared.

Holes stored in effective channel region 11 pass through the p type region under gate wiring 17 to flow in each $p^+$ type channel potential fixing region 4a, 4b. Therefore, the parasitic bipolar effect can be prevented. Further, since first wirings 1 and second wirings 2 are not connected to each other, the gate potentials of two SOI-MOS transistors can be controlled individually. Therefore, a transistor including a plurality of transistors connected in series can be formed. Further, one region 3a of the pair of $n^+$ type source/drain regions shared by two transistors can be made larger in area than the other region 3b, 3c. Therefore, the contact resistance can be reduced.

Further, the structure in which one region 3a of the pair of $n^+$ type source/drain regions is shared by two transistors contributes to reduction of an area occupied by the transistors. Therefore, the device can be more integrated.

Figure 11:
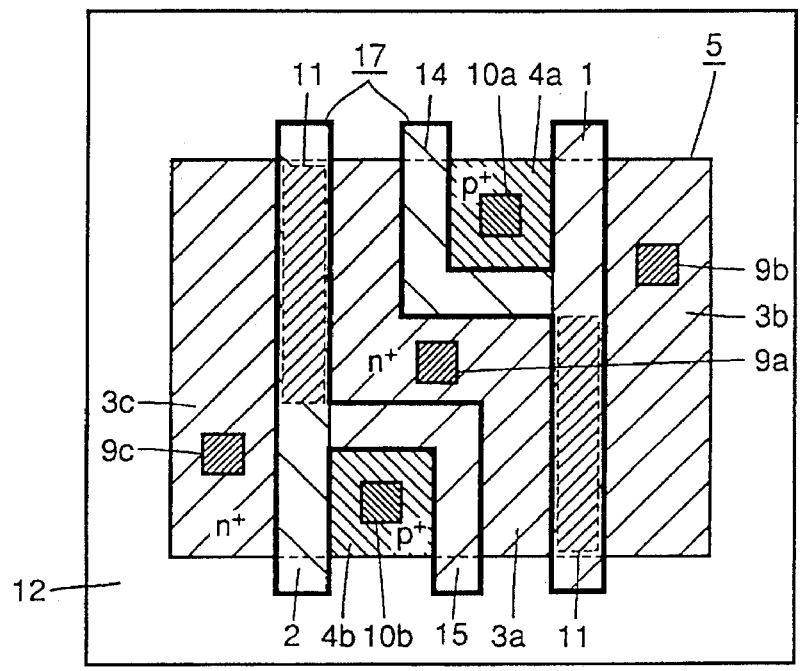
FIG. 11 is a top view showing another SOI-MOS transistor according to the fourth embodiment of the present invention.

In such a structure as shown in FIG. 11 formed by connecting two SOI-MOS transistors shown in FIG. 3, the similar effects can be obtained.

Fifth Embodiment

Figure 12:
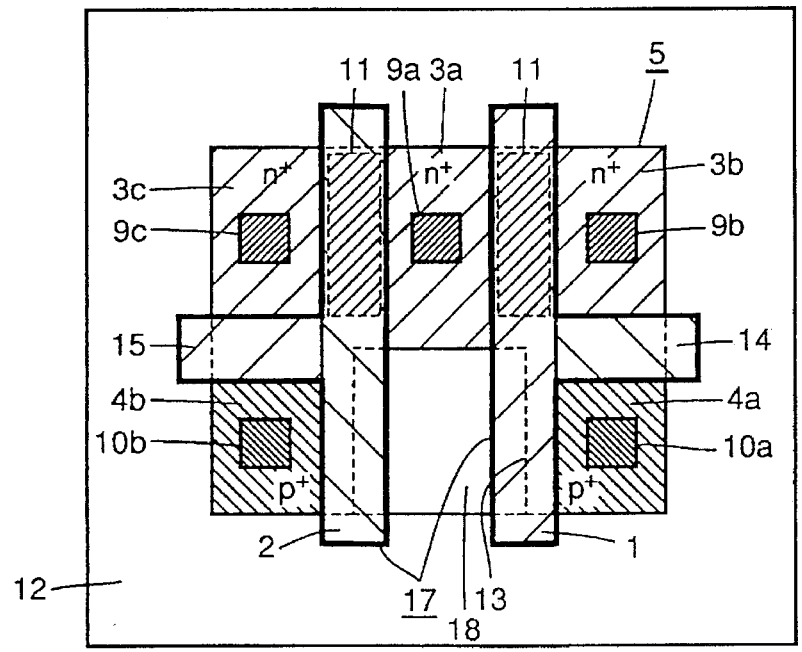
FIG. 12 is a top view showing an SOI-MOS transistor according to a fifth embodiment of the present invention.

The fifth embodiment of the present invention will now be described. Referring to FIG. 12, isolation region 12 includes bay-shaped isolation region 18 going into part of one region 3a of the pair of $n^+$ type source/drain regions shared by two transistors and the region positioned underneath first wiring 1 and second wiring 2 in the SOI-MOS transistor structure shown in FIG. 10. Part 13 of a boundary between bay-shaped isolation region 18 and active region 5 is positioned underneath and along first wiring 1 and second wiring 2.

According to this structure, the contact area between first wiring 1 and second wiring 2, and the region positioned underneath first wiring 1 and second wiring 2 becomes smaller. Therefore, the capacity of the gate wiring can be reduced, and the operation speed of the transistor can be increased.

Figure 13:
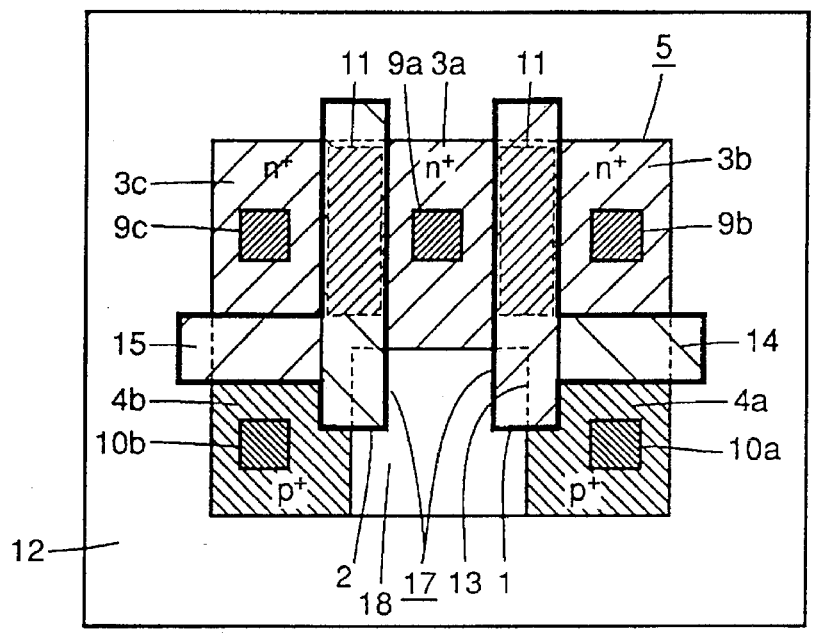
FIG. 13 is a top view showing another SOI-MOS transistor according to the fifth embodiment of the present invention.
Figure 14:
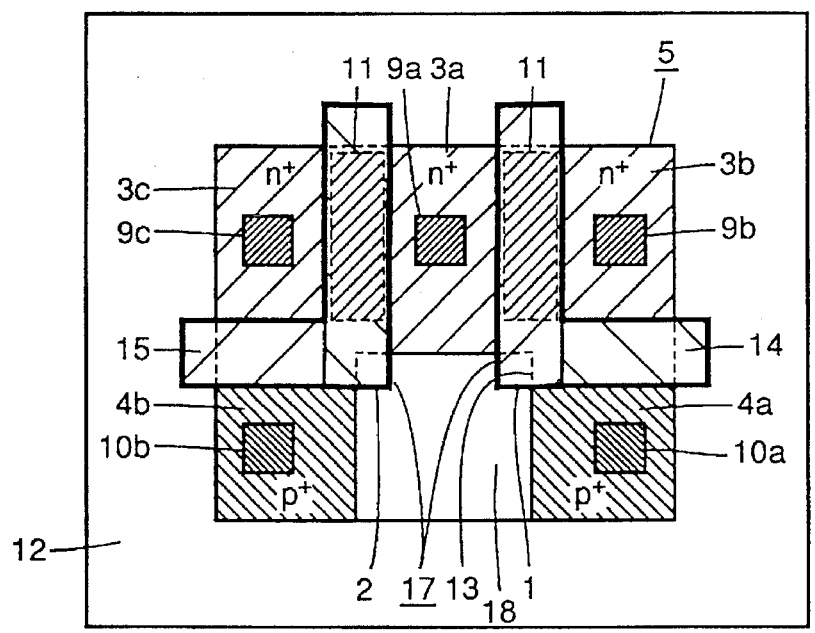
FIG. 14 is a top view showing still another SOI-MOS transistor according to the fifth embodiment of the present invention.

Such a structure as shown in FIG. 12 including two transistors may include such a structure as shown in FIG. 13 or 14.

More specifically, referring to FIG. 13, first wiring 1 and second wiring 2 are shortened in respective portions excluding the wirings on effective channel regions 11. Referring to FIG. 14, the wirings are further shortened, so that gate wirings 17 are structured in an L shape and a reverse L shape.

Figure 15:
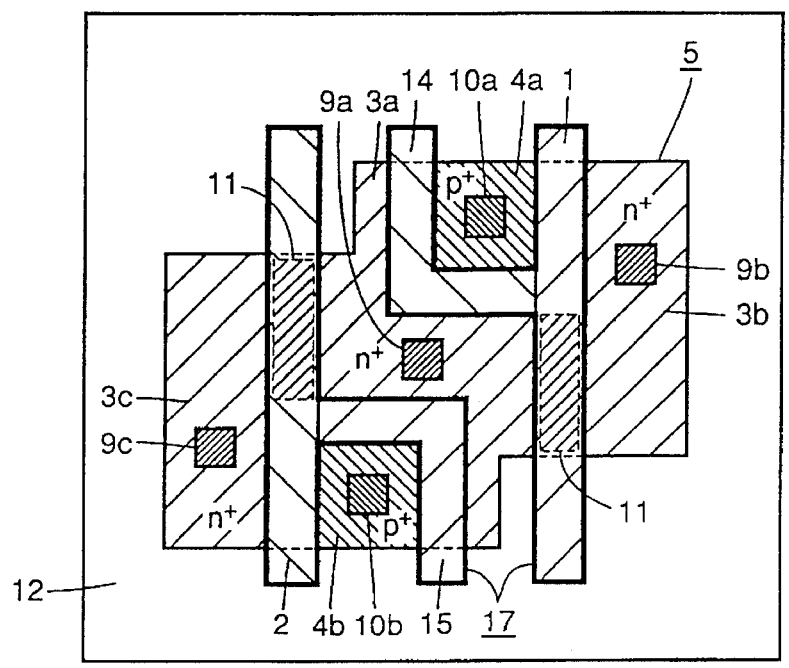
FIG. 15 is a top view showing a further SOI-MOS transistor according to the fifth embodiment of the present invention.

Therefore, the contact area between first wiring 1 and second wiring 2, and the region underneath these wirings is decreased, and the gate capacity can be reduced. As a result, a structure including a plurality of SOI-MOS transistors connected to each other which enables a higher speed operation can be obtained. Further, as shown in FIG. 15, isolation region 12 may go into part of the pairs of n$^+$ type source/drain regions 3a, 3b, 3c of two transistors in the transistor structure shown in FIG. 11. Even in such a structure, the gate capacity can be reduced, and the operation speed of the transistor can be increased.

Sixth Embodiment

Figure 16:
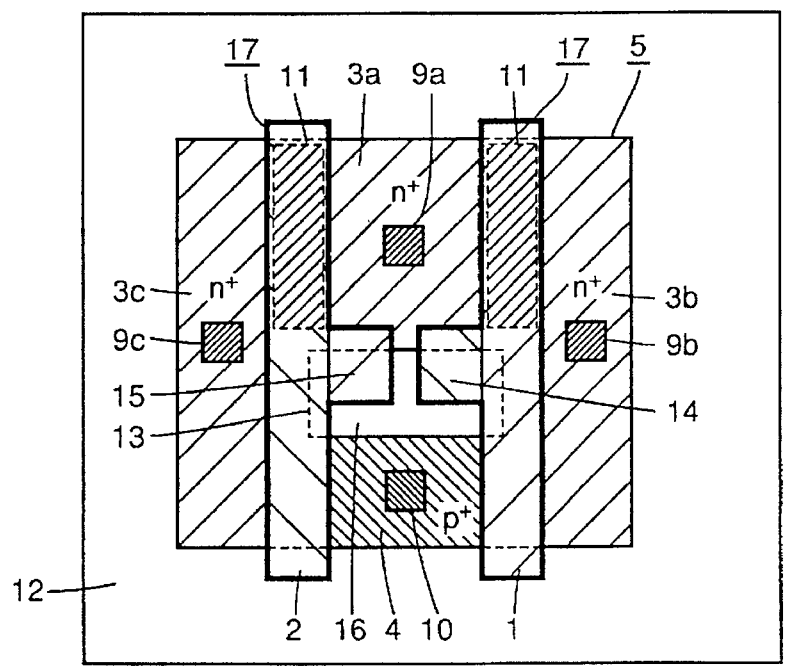
FIG. 16 is a top view showing an SOI-MOS transistor according to a sixth embodiment of the present invention.
Figure 17:
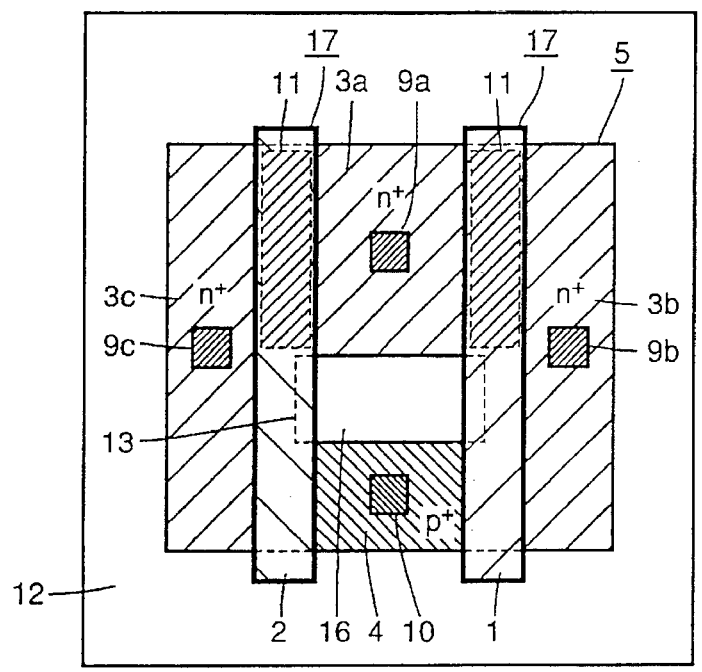
FIG. 17 is a top view showing another SOI-MOS transistor according to the sixth embodiment of the present invention.

Based on the SOI-MOS transistor structure shown in FIG. 8 or 9, such a series connection of two SOI-MOS transistors as shown in FIG. 16 or 17 can be structured.

Referring to FIG. 16, in active region 5 surrounded by isolation region 12, gate wiring 17 includes first wiring 1 and second wiring 2 formed on active region 5 so as to cross the same without crossing each other, and further includes third wiring 14 and fourth wiring 15 extending from respective one side portions of first wiring 1 and second wiring 2 opposite to each other. In a region sandwiched by first wiring 1 and second wiring 2, an island-shaped isolation region 16 which divides the region to two is provided. One region 3a of the pair of n$^+$ type source/drain regions and p$^+$ type channel potential fixing region 4 are positioned on both sides of island-shaped isolation region 16, and the other region 3b, 3c of the pair of n$^+$ source/drain regions is positioned on the respective other side portions of first wiring 1 and second wiring 2. Part 13 of a boundary between island-shaped isolation region 16 and active region 5 is positioned underneath and along first and second wirings 1 and 2.

Further, as shown in FIG. 17, third wiring 14 and fourth wiring 15 may be omitted in the structure of FIG. 16.

According to these structures, gate wirings 17 of two SOI-MOS transistors are not connected to each other.

Therefore, the gate potentials of two SOI-MOS transistors can be controlled individually. Accordingly, a transistor including a plurality of transistors connected in series can be formed. Further, in FIG. 17, third wiring 14 and fourth wiring 15 are not provided. Therefore, the gate capacity can further be reduced. As a result, the operation characteristics of the transistor can further be improved.

Both in FIGS. 16 and 17, one region 3a of the pair of n$^+$ type source/drain regions and p$^+$ type channel potential fixing region 4 are shared by two transistors. Therefore, an area occupied by the transistors can be decreased. As a result, the device can be more integrated.

Seventh Embodiment

Figure 18:
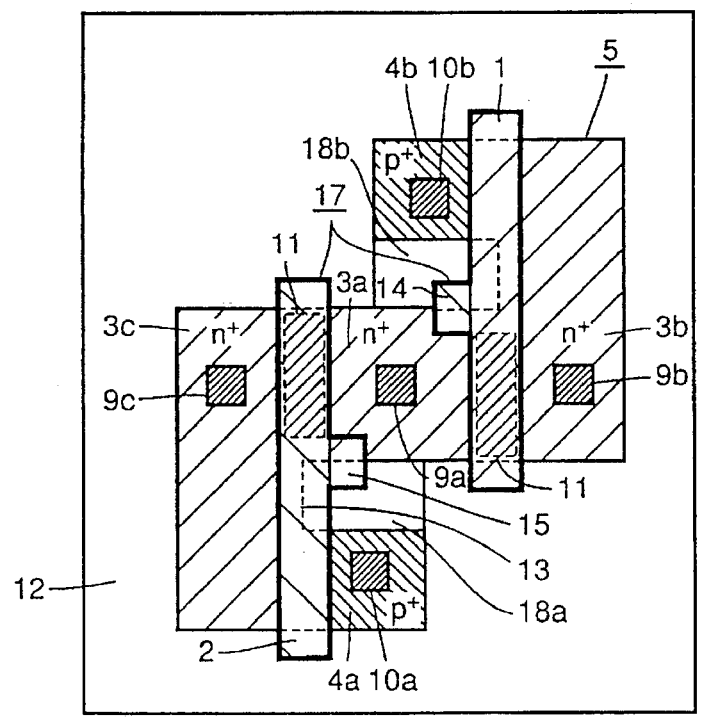
FIG. 18 is a top view showing an SOI-MOS transistor according to a seventh embodiment of the present invention.
Figure 19:
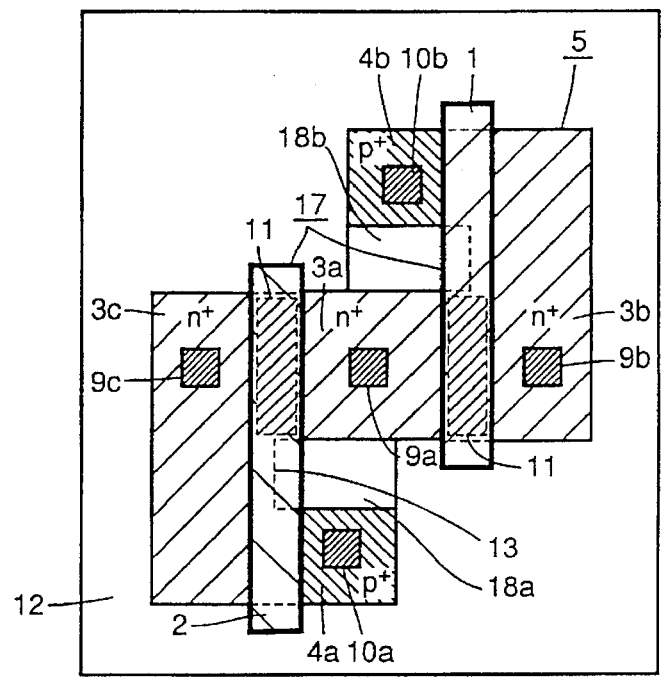
FIG. 19 is a top view showing another SOI-MOS transistor according to the seventh embodiment of the present invention.
Figure 20:
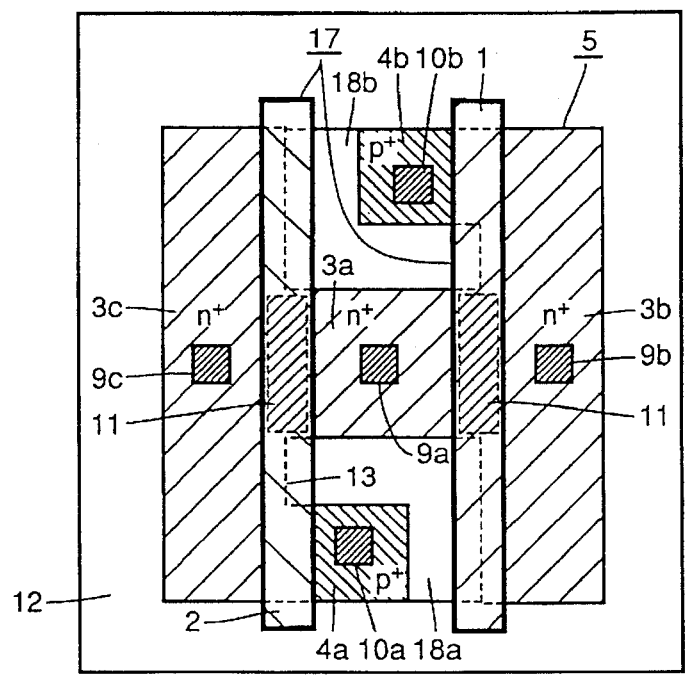
FIG. 20 is a top view showing still another SOI-MOS transistor according to the seventh embodiment of the present invention.

By combining two SOI-MOS transistors shown in FIG. 8 or 9, such an SOI-MOS transistor as shown in FIGS. 18, 19, or 20 can be formed. In either case, the gate potentials of respective transistors can be controlled individually, and the gate capacity can be reduced. Therefore, a transistor superior in the operation characteristics can be obtained.

The above described SOI-MOS transistor structure can easily be formed using a conventional manufacturing technique. One example of the manufacturing method will briefly be described.

Figure 21:
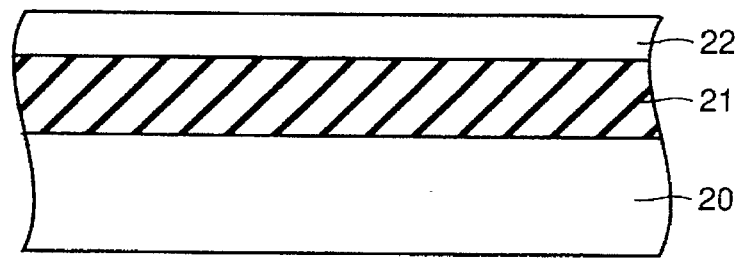
FIG. 21 is a sectional view showing one step of one example of a method of manufacturing the SOI-MOS transistor according to the first embodiment of the present invention.
Figure 22:
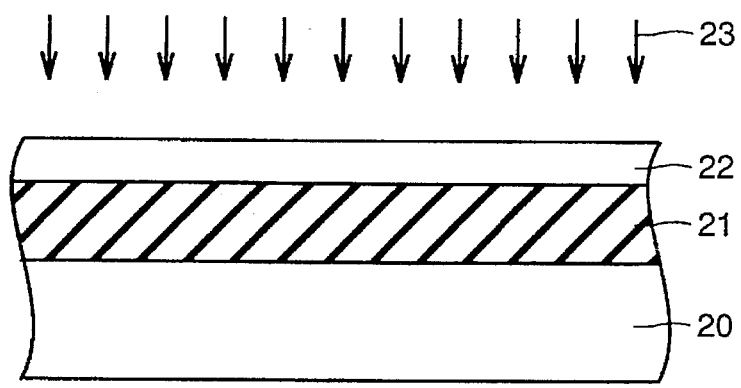
FIG. 22 is a sectional view showing a step to be conducted after the step of FIG. 21 according to the first embodiment of the present invention.
Figure 23:
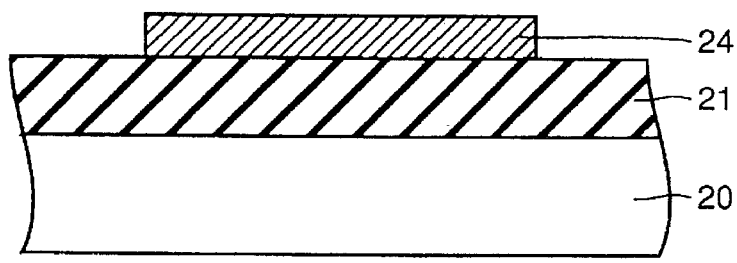
FIG. 23 is a sectional view showing a step to be conducted after the step of FIG. 22 according to the first embodiment of the present invention.
Figure 24:
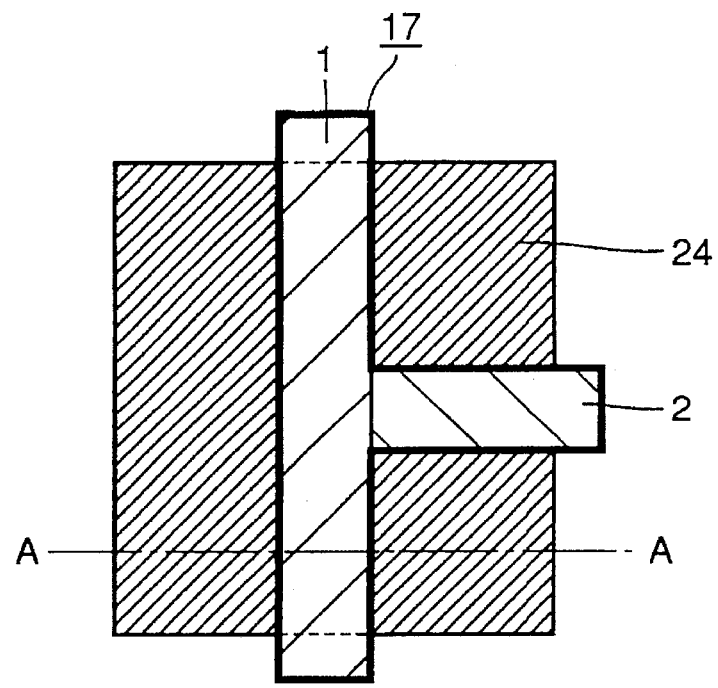
FIG. 24 is a top view showing a step to be conducted after the step of FIG. 23 according to the first embodiment of the present invention.
Figure 25:
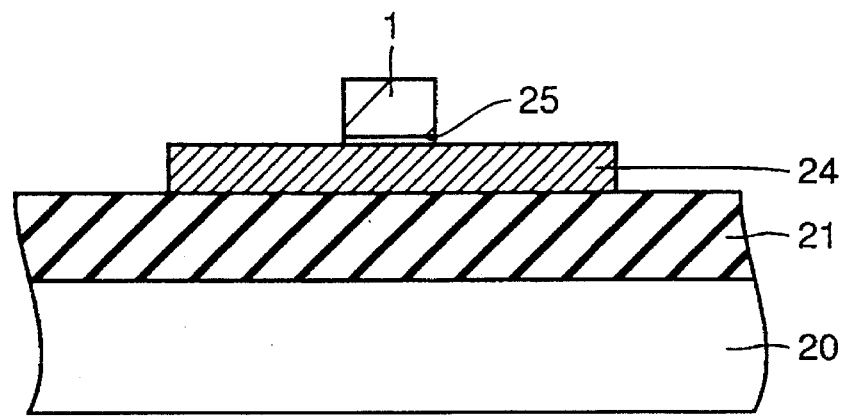
FIG. 25 is a view showing a cross section taken along the line A—A in FIG. 24.
Figure 26:
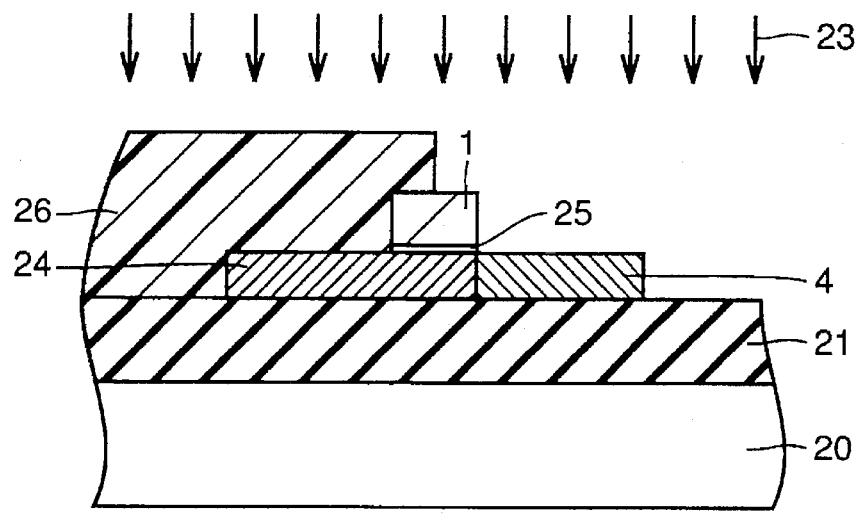
FIG. 26 is a sectional view showing a step to be conducted after the step of FIG. 25 according to the first embodiment of the present invention.
Figure 27:
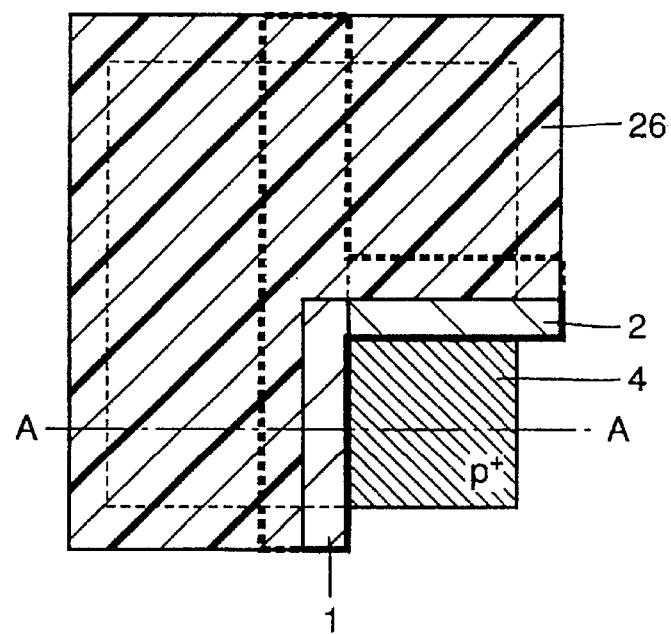
FIG. 27 is a view, seen from the above, of a structure having the cross section shown in FIG. 26.
Figure 28:
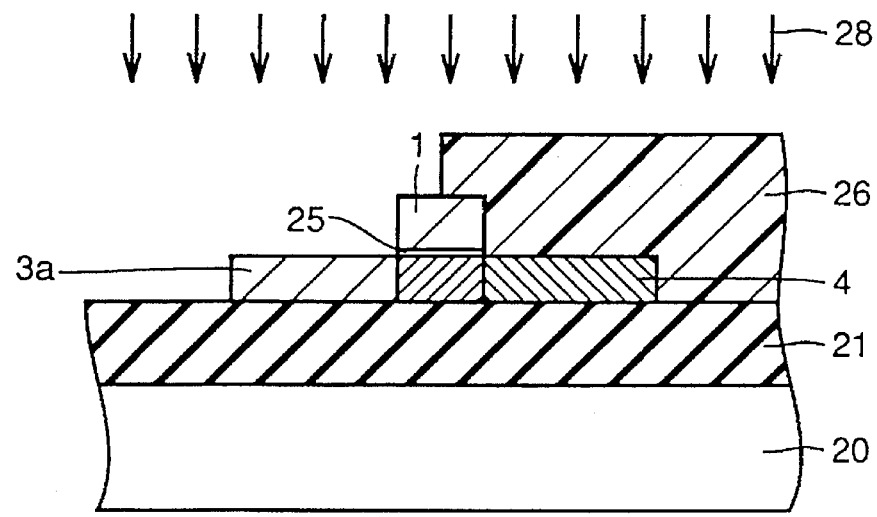
FIG. 28 is a sectional view showing a step to be conducted after the step of FIG. 26 according to the first embodiment of the present invention.
Figure 29:
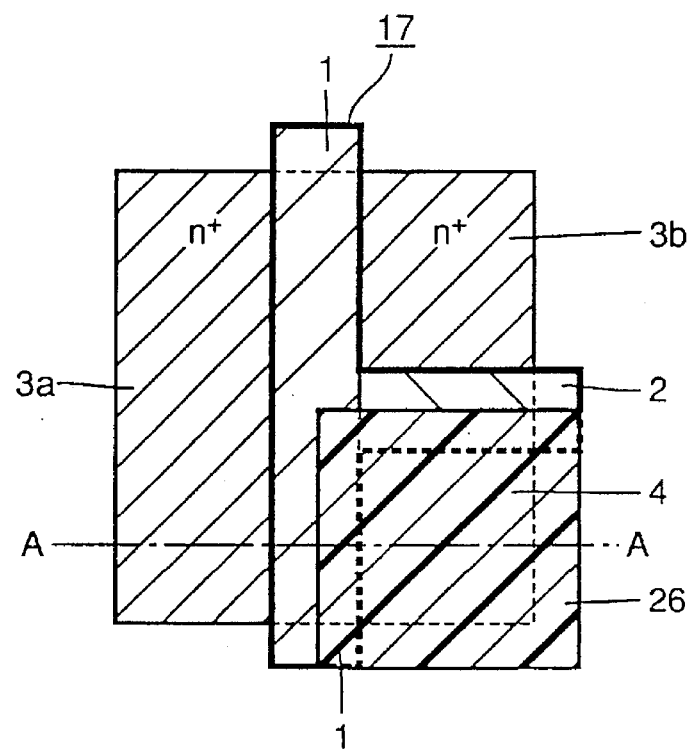
FIG. 29 is a view, seen from the above, of a structure having the cross section shown in FIG. 28.
Figure 30:
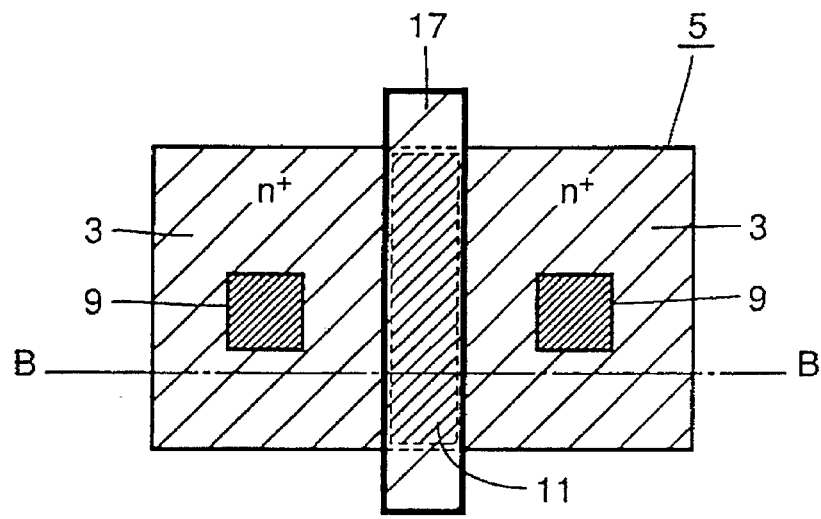
FIG. 30 is a top view showing one example of a structure of a conventional SOI-MOS transistor.
Figure 31:
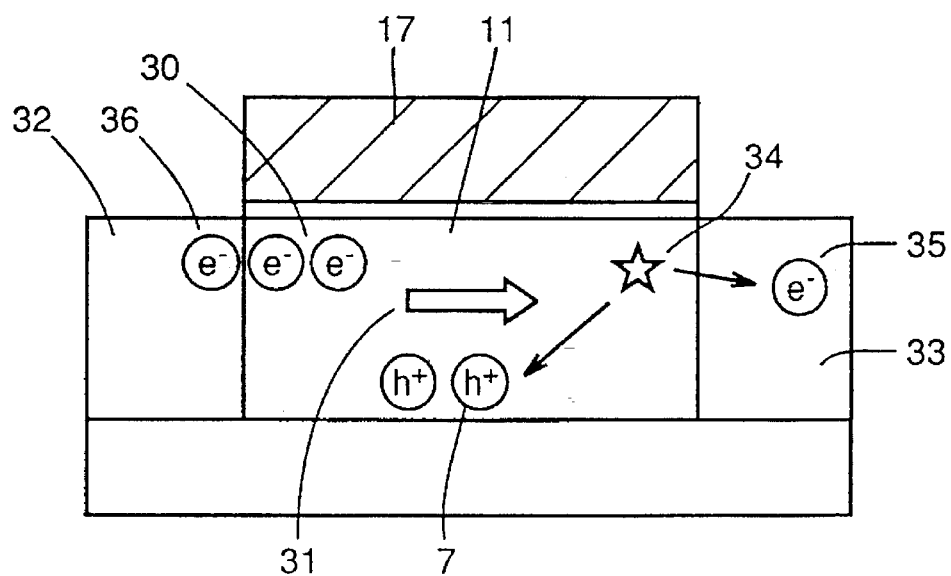
FIG. 31 is a sectional view showing the vicinity of a gate wiring taken along the line B—B in FIG. 30, indicating an electron-hole flow.
Figure 32:
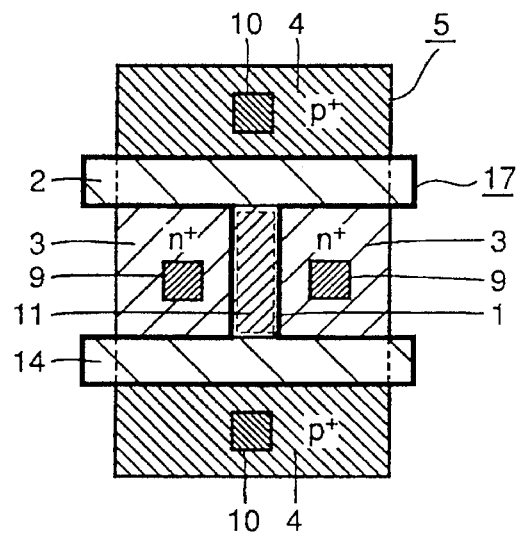
FIG. 32 is a top view showing one example of a structure of a conventional improved SOI-MOS transistor.
Figure 33:
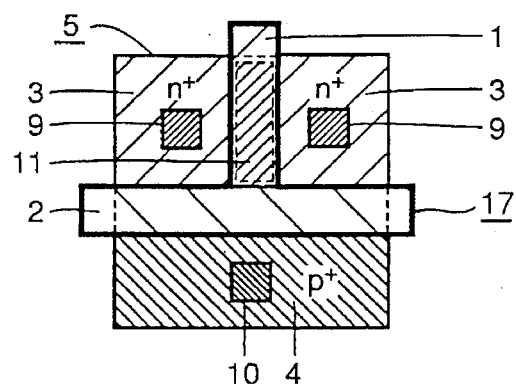
FIG. 33 is a top view showing another example of the structure of the conventional improved SOI-MOS transistor.
Figure 34:
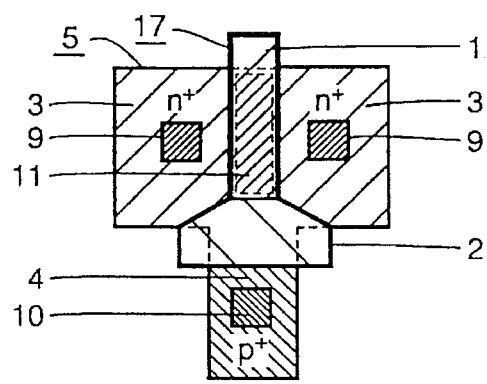
FIG. 34 is a top view showing still another example of the structure of the conventional improved SOI-MOS transistor.
Figure 35:
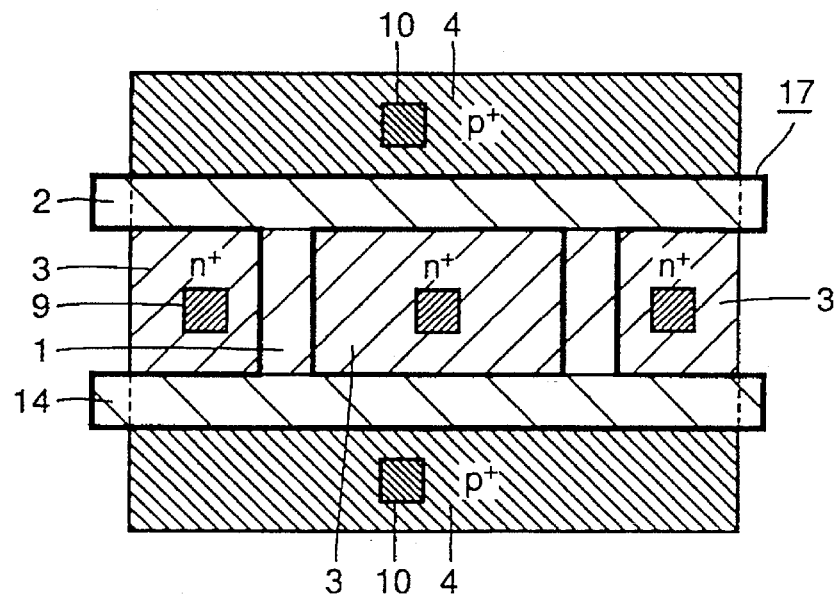
FIG. 35 is a top view showing a connection of two transistors shown in FIG. 32.
Figure 36:
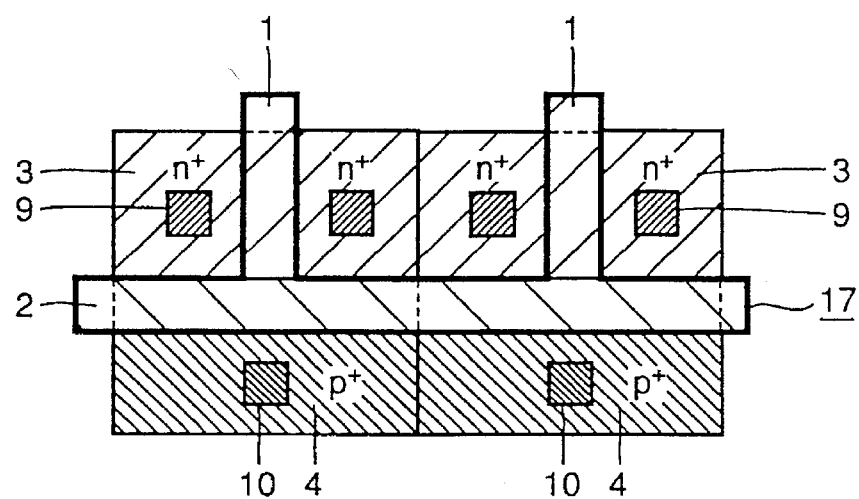
FIG. 36 is a top view showing a connection of two transistors shown in FIG. 33.
Figure 37:
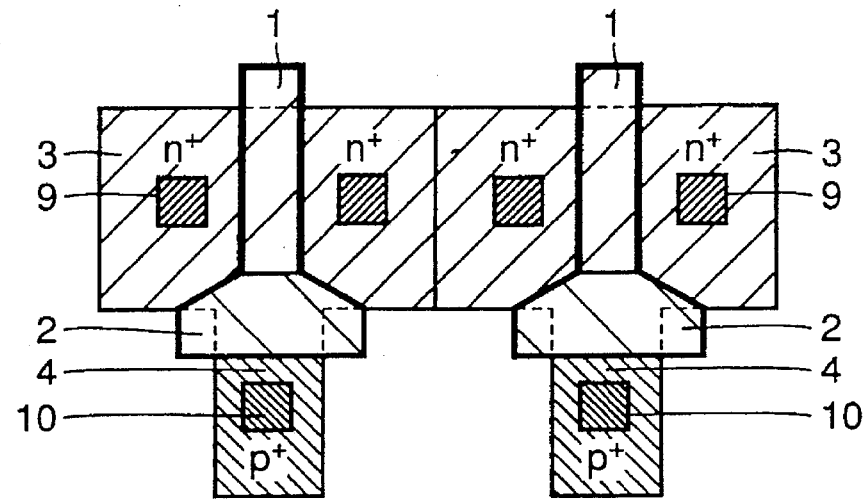
FIG. 37 is a top view showing a connection of two transistors shown in FIG. 34.
Figure 38:
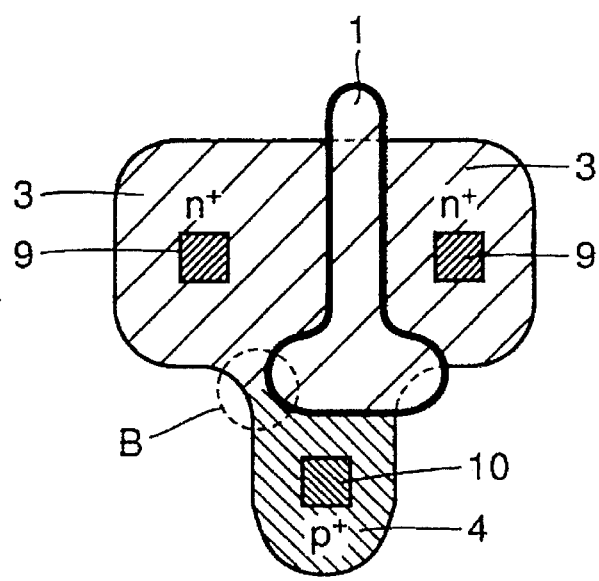
FIG. 38 is a view, seen from the above, of a state in which the gate wiring of the transistor shown in FIG. 34 is positionally deviated.

With an SIOX method (Separation by Implanted Oxygen), a predetermined heat treatment is carried out after implantation of oxygen ions to a silicon substrate 20 to form an SOI substrate of a silicon layer 22, an insulating layer 21, and silicon substrate 20, as shown in FIG. 21. Then, as shown in FIG. 22, boron ions 23 are implanted in silicon layer 22 with a dosage of $10^{11}$ to $10^{12}/cm^2$ to form a p type semiconductor layer. Predetermined lithography and processing are carried out to form a p type region 24 as shown in FIG. 23. Then, gate wiring 17 having first wiring 1 and second wiring 2 is formed of a metal polycide film, as shown in FIG. 24, after interposing a gate oxide film 25 therebetween. FIG. 25 shows a cross section taken along the line A—A in FIG. 24. After that, boron ions 23 are implanted with a dosage of $10^{15}/cm^2$ with a predetermined region covered with photoresist to form p$^+$ type channel potential fixing region 4, as shown in FIG. 26. FIG. 26 shows a cross section taken along the line A—A in FIG. 27. After that, photoresist 26 is removed. Further, lithography is carried out, and arsenic ions 28 are implanted with a dosage of $10^{15}/cm^2$ with photoresist 26 used as a mask to form n$^+$ type source/drain region 3a, 3b, as shown in FIG. 28. FIG. 28 is a cross section taken along the line A—A in FIG. 29. After that, photoresist 26 is removed. Through the above described steps, such an SOI-MOS transistor as shown in FIG. 1 can easily be formed.

Note that in a 256 MDRAM, for example, the width of the gate wiring is 0.3 μm, and the size of n$^+$ source/drain contact 9a, 9b, 9c and p$^+$ type channel potential fixing contact 10, 10a, 10b is 0.3 μm×0.3 μm in design.

The registration accuracy of the gate wiring or the like is estimated to be 0.06 μm.

In the above description, an example of an n channel transistor having a p type channel region was shown. A p channel transistor can be formed similarly.

In this case, an n type channel region can be formed by implanting phosphorous, and a p type source/drain region can be formed by implanting BF$_2$, for example.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An SOI type semiconductor device including an active region of a semiconductor layer formed on an insulating film and surrounded by an isolation region, and a gate wiring, wherein said gate wiring includes
  a first wiring formed on said active region so as to cross said active region, and
  a second wiring formed from one side portion of said first wiring toward said isolation region,
said active region includes
  a first region positioned on the other side portion of said first wiring, and
  second and third regions positioned on both sides of said second wiring on one side portion of said first wiring,
said first to third regions each have a region allowing formation of a contact for an electric connection with another element in their surfaces,
said first and second regions are of a first conductivity type,
said third region and a region positioned underneath said gate wiring are of a second conductivity type, and
said first wiring and said first and second regions constitute an SOI-MOS transistor.

2. The semiconductor device according to claim 1, wherein
said isolation region goes into said first region and a region positioned underneath said gate wiring, and
a part of a boundary between said isolation region and said active region is positioned underneath and along said first wiring.

3. The semiconductor device according to claim 1, wherein
said isolation region includes a bay-shaped isolation region going into said third region and the region positioned underneath said gate wiring, and
a part of a boundary between said isolation region and said active region is positioned underneath and along said first wiring and said second wiring.

4. An SOI type semiconductor device including an active region of a semiconductor layer formed on an insulating film and surrounded by an isolation region, and a gate wiring, wherein
said gate wiring includes a wiring formed on said active region so as to cross said active region, and
said isolation region includes, in a region positioned on the other side portion of said wiring, a bay-shaped isolation region which goes underneath said wiring so as to divide said region to two and whose boundary with said active region is partly positioned underneath and along said wiring,
said active region includes
a first region positioned on one side portion of said wiring, and
second and third regions positioned on both sides of said bay-shaped isolation region on the other side portion of said wiring,
said first to third regions each have a size allowing formation of a contact for an electric connection with another element in their surfaces,
said first and second regions are of a first conductivity type,
said third region and the region positioned underneath said gate wiring are of a second conductivity type, and
said wiring, and said first and second regions constitute an SOI-MOS transistor.

5. An SOI type semiconductor device including an active region of a semiconductor layer formed on an insulating film and surrounded by an isolation region, and a gate wiring, wherein
said gate wiring includes
  a first wiring and a second wiring formed on said active region so as to cross said active region without crossing each other, and
  a third wiring formed from one side portion of said first wiring toward said isolation region, and
  a fourth wiring formed from one side portion of said second wiring toward said isolation region,
said active region includes
  a first region positioned on the other side portion of said first wiring and the other side portion of said second wiring,
  second and third regions positioned on both sides of said third wiring on one side portion of said first wiring, and
  fourth and fifth regions positioned on both sides of said fourth wiring on one side portion of said second wiring,
said first to fifth regions each have a size allowing formation of a contact for an electric connection with another element in their surfaces,
said first, second, and fourth regions are of a first conductivity type,
said third and fifth regions, and a region positioned underneath said gate wiring are of a second conductivity type, and
said first and second wirings, and said first, second, and fourth regions constitute an SOI-MOS transistor.

6. The semiconductor device according to claim 5, wherein
said isolation region includes a bay-shaped isolation region going into said first region and the region positioned underneath said gate wiring, and
a part of a boundary between said bay-shaped isolation region and said active region is positioned underneath and along said first and second wirings.

7. An SOI type semiconductor device including an active region of a semiconductor layer formed on an insulating film and surrounded by an isolation region, and a gate wiring, wherein
said gate wiring includes
  a first wiring and a second wiring formed on said active region so as to cross said active region without crossing each other, and
  a third wiring and a fourth wiring formed from respective one side portions of said first wiring and said second wiring opposite to each other toward said isolation region without crossing each other,
said active region includes
  a first region positioned on respective one side portions of said first and second wirings and on respective one side portions of said third and fourth wirings opposite to each other,
  a second region positioned on one side portion of said first wiring and the other side portion of said third wiring,
  a third region positioned on one side portion of said second wiring and the other side portion of said fourth wiring,
  a fourth region positioned on the other side porion of said first wiring, and
  a fifth region positioned on the other side portion of said second wiring,
said first to fifth regions each have a size allowing formation of a contact for an electric connection with another element in their surfaces, said first, fourth, and fifth regions are of a first conductivity type, said second and third regions, and the region positioned underneath said gate wiring are of a second conductivity type, and said first and second wirings, and said first, fourth, and fifth regions constitute an SOI-MOS transistor.

8. An SOI type semiconductor device including an active region of a semiconductor layer formed on an insulating film and surrounded by an isolation region, and a gate wiring, wherein said gate wiring includes
a first wiring and a second wiring formed on said active region so as to cross said active region without crossing each other,
an island-shaped isolation region is provided, in a region positioned on respective one side portions of said first wiring and said second wiring opposite to each other, which divides said region to two, which goes into a region positioned underneath said first and second wirings, and whose boundary with said active region is partly positioned underneath and along said first and second wirings, said active region includes
first and second regions positioned on both sides of said island-shaped isolation region,
a third region positioned on the other side portion of said first wiring, and
a fourth region positioned on the other side portion of said second wiring, said first to fourth regions each have a size allowing formation of a contact for an electric connection with another element in their surfaces, said first, third, and fourth regions are of a first conductivity type, said second region and the region positioned underneath said gate wiring are of a second conductivity type, and said first and second wirings, and said first, third, and fourth regions constitute an SOI-MOS transistor.

9. An SOI type semiconductor device including an active region of a semiconductor layer formed on an insulating film and surrounded by an isolation region, and a gate wiring, wherein said gate wiring includes
a first wiring and a second wiring formed on said active region so as to cross said active region without crossing each other, said isolation region includes, in a region positioned on respective one side portions of said first wiring and said second wiring opposite to each other, first and second bay-shaped isolation regions which go into said region in two directions, and whose boundary with said active region is partly positioned underneath and along said first and second wirings, said active region includes in said region
a first region sandwiched by said first and second bay-shaped isolation regions,
a second region surrounded by said first bay-shaped isolation region, said isolation region, and said second wiring,
a third region surrounded by said second bay-shaped isolation region, said isolation region, and said first wiring,
a fourth region positioned on the other side portion of said first wiring, and
a fifth region positioned on the other side portion of said second wiring, said first to fifth regions each have a size allowing formation of a contact for an electric connection with another element in their surfaces, said first, fourth, and fifth regions are of a first conductivity type, said second and third regions and the region positioned underneath said gate wiring are of a second conductivity type, and said first and second wirings, and said first, fourth, and fifth regions constitute an SOI-MOS transistor.

* * * * *